US012676580B2

(12) United States Patent
Calvo et al.

(10) Patent No.: US 12,676,580 B2

(45) Date of Patent: Jul. 7, 2026

(54) DC OFFSET CALIBRATION IN AN INTERDEPENDENT QUADRATURE RECEIVER

(71) Applicant: Silicon Laboratories Inc., Austin, TX (US)

(72) Inventors: Christopher Calvo, Plantation, FL (US); Robert Gorday, Gainesville, FL (US); Michael Wu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 74 days.

(21) Appl. No.: 18/616,397

(22) Filed: Mar. 26, 2024

(65) Prior Publication Data

US 2025/0309827 A1 Oct. 2, 2025

(51) Int. Cl.
| | |
|---|---|
| *H03D 3/00* | (2006.01) |
| *H03D 7/16* | (2006.01) |
| *H03F 3/45* | (2006.01) |

(52) U.S. Cl.
CPC ............. *H03D 3/008* (2013.01); *H03D 7/165* (2013.01); *H03F 3/45973* (2013.01); *H03F 2200/294* (2013.01); *H03F 2200/451* (2013.01)

(58) Field of Classification Search
CPC .... H03D 3/008; H03D 7/165; H03F 3/45973; H03F 2200/294; H03F 2200/451; H04L 25/061; H04B 17/21; H04B 2001/305
See application file for complete search history.

(56) References Cited

U.S. PATENT DOCUMENTS

| | | | |
|---|---|---|---|
| 2009/0264090 A1* | 10/2009 | Ivonnet | H04L 25/06 |
| | | | 455/233.1 |
| 2015/0256214 A1* | 9/2015 | Lee | H04B 17/14 |
| | | | 455/83 |
| 2015/0365118 A1* | 12/2015 | Khan | H03G 3/3068 |
| | | | 375/345 |

(Continued)

OTHER PUBLICATIONS

Fengjie Wang, Liyi Fan, Yupeng Shen, Hua Chen, Jiarui Liu, Zhiyu Wang, and Faxin Yu, "An effective DC offset calibration method combined with analog and digital circuits for direct conversion receivers", IEICE Electronics Express, vol. 16, No. 19, 1-6, China, Sep. 17, 2019 (Year: 2019).*

(Continued)

*Primary Examiner* — Aristocratis Fotakis

(74) *Attorney, Agent, or Firm* — Trop, Pruner & Hu, P.C.

(57) ABSTRACT

In one aspect, an apparatus includes: a low noise amplifier (LNA) to receive and amplify a radio frequency (RF) signal; a mixer coupled to the LNA to downconvert the RF signal to a second frequency signal; a quadrature transimpedance amplifier (TIA) to convert a current of the second frequency signal to a voltage signal, the quadrature TIA having an in-phase (I)-channel having an I-channel DC offset and a quadrature-phase (Q)-channel having a Q-channel DC offset; and a DC offset calibration circuit coupled to the quadrature TIA. The DC offset calibration circuit is configured to calibrate a DC offset of the quadrature TIA. The DC offset calibration circuit may be configured to independently determine an I-channel DC offset setting and independently determine a Q-channel DC offset setting, where the I-channel and Q-channels have a DC offset interdependency.

19 Claims, 7 Drawing Sheets

(56)                      References Cited

U.S. PATENT DOCUMENTS

| | | | | |
|---|---|---|---|---|
| 2016/0173048 A1* | 6/2016 | Waheed | ................. | H04B 17/21 |
| | | | | 375/345 |
| 2016/0380788 A1* | 12/2016 | Waheed | .................. | H04B 1/30 |
| | | | | 375/319 |
| 2025/0070894 A1* | 2/2025 | Wu | ........................ | H04B 1/525 |
| 2025/0202601 A1* | 6/2025 | Doaré | .................. | G01S 7/4017 |

OTHER PUBLICATIONS

U.S. Appl. No. 18/601,087, filed Mar. 11, 2024, entitled "Pad Attenuator to Improve Receiver Linearity," by Pavel Konecny.

\* cited by examiner

300

350

DC OFFSET CALIBRATION IN AN INTERDEPENDENT QUADRATURE RECEIVER

BACKGROUND

Most receivers rely on some form of baseband gain and filtering to condition a desired signal and reject all others. These receive chains can at times have lots of gain in the lineup and any DC offsets early in the chain will be gained up by subsequent stages, which can limit the dynamic range. As such, circuitry is typically implemented to detect the DC offset and correct for it. In certain quadrature receivers, correction is implemented by inducing purposeful offset that consequently reflect to the input of an amplifier. Such input is directly coupled to the output of a mixer, which creates a charge sharing effect that causes a DC offset interdependence between quadrature channels of the receiver. This interdependence renders conventional DC offset correction methods futile.

SUMMARY OF THE INVENTION

In one aspect, an apparatus includes: a low noise amplifier (LNA) to receive and amplify a radio frequency (RF) signal; a mixer coupled to the LNA to downconvert the RF signal to a second frequency signal; a quadrature transimpedance amplifier (TIA) to convert a current of the second frequency signal to a voltage signal, the quadrature TIA having an in-phase (I)-channel having an I-channel DC offset and a quadrature-phase (Q)-channel having a Q-channel DC offset; and a DC offset calibration circuit coupled to the quadrature TIA. The DC offset calibration circuit is configured to calibrate a DC offset of the quadrature TIA comprising the I-channel DC offset and a Q-channel DC offset. This DC offset calibration circuit may be configured to independently determine an I-channel DC offset setting and independently determine a Q-channel DC offset setting, where the I-channel and the Q-channel of the quadrature TIA have a DC offset interdependency.

In an implementation, the DC offset calibration circuit comprises a sequencer to initiate the DC offset calibration in response to a trigger condition. The sequencer may control operation of the DC offset calibration according to a successive approximation. The sequencer may cause an initial Q-channel DC offset setting to be provided to the Q-channel and cause the DC offset calibration circuit to determine a first I-channel DC offset setting according to the successive approximation. The sequencer may thereafter cause the first I-channel DC offset setting to be provided to the I-channel and cause a determination of a first Q-channel DC offset according to the successive approximation.

In an example, the DC offset calibration circuit is to iteratively determine the first I-channel DC offset setting and the first Q-channel DC offset setting, and iterate until a convergence is detected. The DC offset calibration circuit may determine the convergence when a successive I-channel DC offset is within at least a threshold of the first I-channel DC offset. The DC offset calibration circuit may perform the DC offset calibration during a factory test and store a seed I-channel DC offset setting and a seed Q-channel DC offset setting in a non-volatile storage. In turn, the DC offset calibration circuit is to provide the seed Q-channel DC offset setting as the initial Q-channel DC offset setting.

In another aspect, a method includes: initiating a DC offset calibration for a quadrature differential amplifier having a first channel and a second channel, the first channel and the second channel having DC offset interdependency; iteratively, until a convergence is detected: calibrating at least one of: the second channel to determine a DC offset setting for the second channel while a DC offset setting for the first channel is held; and the first channel to determine the DC offset setting for the first channel while the DC offset setting for the second channel is held; storing a converged DC offset setting for the first channel in a first storage; storing a converged DC offset setting for the second channel in a second storage; and providing the converged DC offset setting for the first channel and the converged DC offset setting for the second channel to the quadrature differential amplifier to provide DC offset compensation.

In an example, the method further comprises detecting the convergence for the second channel when a successive DC offset setting for the second channel equals a preceding DC offset setting for the second channel. The method also may include detecting the convergence for the second channel when a successive DC offset setting for the second channel is within a threshold of a preceding DC offset setting for the second channel.

In an embodiment, initiating the DC offset calibration comprises providing an initial DC offset setting for the first channel. Providing the initial DC offset setting for the first channel may include providing a seed DC offset setting for the first channel, the seed DC offset setting for the first channel obtained from a non-volatile storage.

In an implementation, the method includes providing the converged DC offset setting for the first channel and the converged DC offset setting for the second channel to at least one digital-to-analog converter (DAC), the at least one DAC to output therefrom a DC offset compensation for the first channel and a DC offset compensation for the second channel.

The method also may include, if the convergence is not detected, iteratively calibrating the second channel and the first channel for a predetermined number of iterations.

In yet another aspect, a system includes: an antenna to receive a RF signal; a LNA coupled to the antenna to amplify the RF signal; a mixer coupled to the LNA to down convert the RF signal to a second frequency signal; a quadrature differential amplifier to amplify the second frequency signal and output a quadrature differential signal, the quadrature differential amplifier having an I-channel having an I-channel DC offset and a Q-channel having a Q-channel DC offset, wherein the I-channel and the Q-channel have DC offset interdependency; a DC offset calibration circuit coupled to the quadrature differential amplifier, the DC offset calibration circuit to independently determine, based at least in part on a seed value for at least one of the I-channel or the Q-channel, an I-channel DC offset setting and a Q-channel DC offset setting, to compensate for the I-channel DC offset and the Q-channel DC offset; a comparator coupled to the quadrature differential amplifier to detect a DC offset minimum from the quadrature differential signal; and a non-volatile memory to store the seed value for the at least one of the I-channel or the Q-channel.

In an implementation, the DC offset calibration circuit is to: calibrate the I-channel to determine the I-channel DC offset setting while the seed value for the Q-channel is held; and calibrate the Q-channel to determine the Q-channel DC offset setting while the I-channel DC offset setting is held. The DC offset calibration circuit may iteratively calibrate the I-channel and the Q-channel until a convergence is detected.

In an implementation, the system further comprises a DAC to receive the I-channel DC offset setting and the Q-channel DC offset setting and output, based thereon, an I-channel DC offset compensation value and a Q-channel DC offset compensation value.

DETAILED DESCRIPTION

In various embodiments, a receiver is configured with a signal processing path that has interdependency between channels. In such implementations, embodiments provide a DC offset calibration capability to accurately and quickly determine a necessary DC offset compensation of the different channels in an independent manner, despite the interdependent nature of the receiver.

As will be described herein, embodiments may implement a successive approximation technique to determine DC offset compensation values for the interdependent channels in an independent manner, e.g., by ping-ponging back and forth between calibrations of the channels. In embodiments, a hardware sequencer may be implemented to enable rapid resolution of the DC offset calibration. Although embodiments are not limited in this regard, in an example calibration process a single calibration iteration can be performed in approximately 2 microseconds (μs), and a binary search can be performed to find an optimal DC offset compensation setting. Assuming a maximum of 8 iterations at 2 μs each, calibration can be performed in under 16 μs.

Still further, a seeding function can be used to start the calibration process using seed values previously obtained. In one or more embodiments, these seed values may be determined during a factory test of the receiver, which may occur in ambient conditions. The resulting DC offset compensation values can be stored in a one-time programmable memory or other non-volatile storage as seed values. These seed values can be used to enable a more rapid resolution of in-field calibrations. For example, a seeding function helps to reduce the number of iterations required to calibrate effectively speeding up the overall calibration time, e.g., to less than 10 μs. in a particular implementation, when temperature has not changed drastically calibration can be achieved in 1 or 2 iterations.

Figure 1:
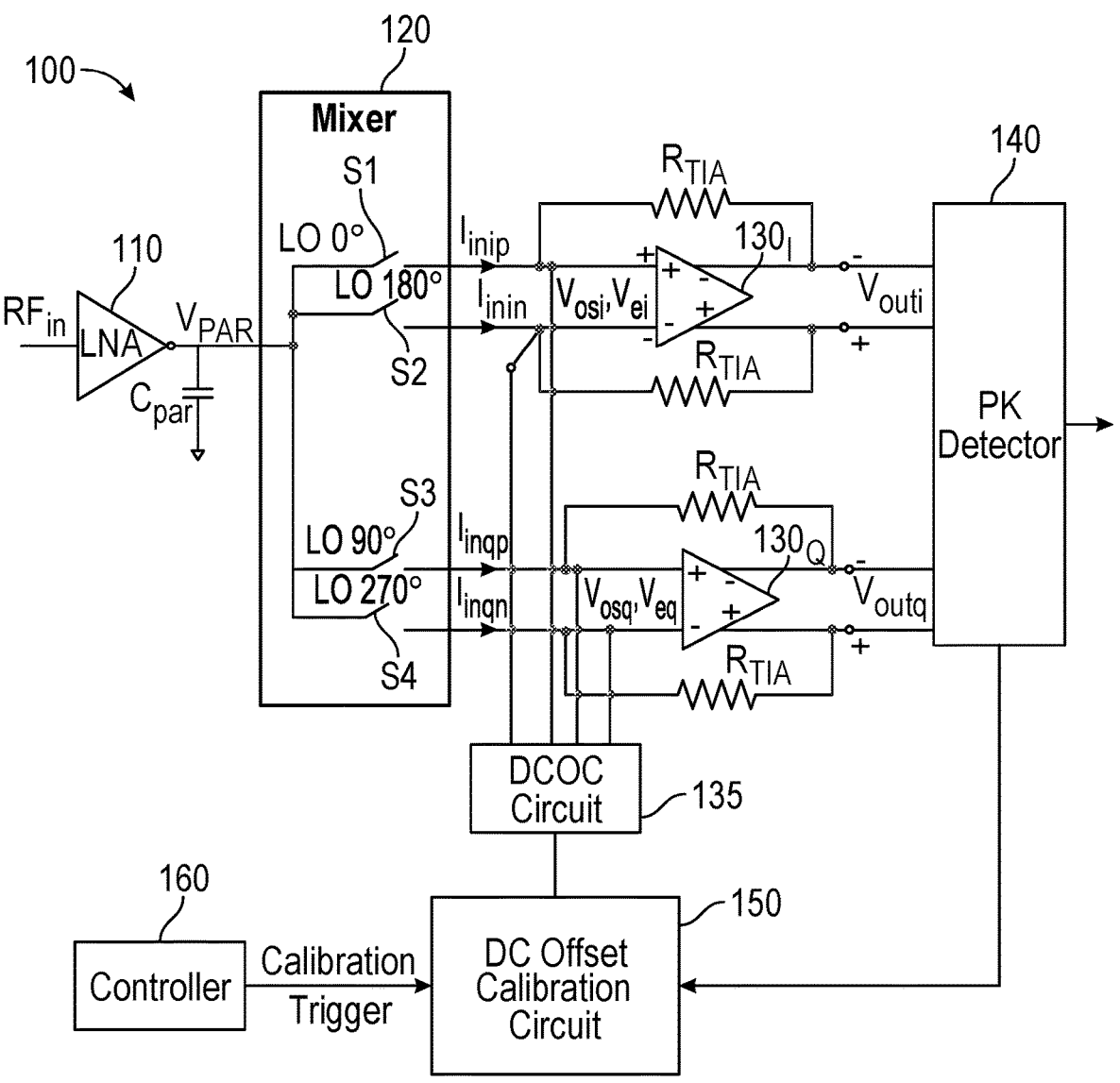
FIG. 1 is a block diagram of a portion of a receiver in accordance with an embodiment.

Referring now to FIG. 1, shown is a block diagram of a portion of a receiver in accordance with an embodiment. In the illustration of FIG. 1, a portion of a receiver signal processing path of a receiver 100 is shown. Receiver 100 may be may part of any type of wireless device, ranging from small Internet of Things (IoT) devices to larger devices such as smartphones, tablet computers, laptop computers, to even larger systems, such as client computer systems, wireless TVs and so forth. An incoming radio frequency (RF) signal is received and amplified in a low noise amplifier (LNA) 110. The amplified RF signal is provided from LNA 110 to a quadrature mixer 120, which may operate in a current mode. Also shown is a parasitic capacitance Cpar, which represents a parasitic capacitance of LNA 110.

In embodiments herein, quadrature mixer 120 may be implemented as a passive mixer having a plurality of switches S1-S4. In operation, when a given switch is enabled by a local oscillator (LO) signal, provided by a local oscillator (not shown for ease of illustration in FIG. 1), the RF signal is downconverted to a lower frequency signal, e.g., an intermediate frequency (IF) signal.

Still referring to FIG. 1, the downconverted IF signals, which are differential quadrature signals, are provided to inputs of a transimpedance amplifier (TIA) 130. More specifically, TIA 130 is implemented as a differential quadrature TIA having an in-phase (I)-channel $130_i$ and a quadrature-phase (Q)-channel $130_q$. In the high level shown in FIG. 1, TIA 130 is represented as an operational amplifier (opamp) with feedback by way of resistors $R_{TIA}$. Of course, additional circuitry may be present in a detailed implementation. For example, each opamp may include or be coupled to offset compensation circuitry. In the high level shown in FIG. 1, this DC offset compensation (DCOC) circuit 135 is shown separately from TIA 130. However, in one or more implementations, such circuitry may be included within TIA 130.

In general, DCOC circuit 135 may be implemented as a resistor digital-to-analog converter (DAC). This resistor DAC operates to receive a digital control code, referred to herein as a DC offset setting. Based on this DC offset setting, switches of the resistor DAC are controlled to selectively enable a programmable amount of resistance, to provide an offset voltage ($V_{osi,osq}$) to the corresponding channel.

In embodiments herein, although quadrature mixer 120 creates a DC offset interdependency between the I and Q-channel TIA 130, a DC offset calibration can be performed in an independent manner to independently determine appropriate DC offset settings for the I and Q-channels, as will be described further below.

Still referring to FIG. 1, the outputs of TIA 130, which are quadrature differential voltages representing the input signal, are provided to a peak detector 140. Peak detector 140 operates to detect a peak signal that may be sent to additional processing circuitry, including baseband processing circuitry, a digital signal processor or so forth. In addition, via a comparator included within peak detector 140, feedback information is provided to a DC offset calibration circuit 150. DC offset calibration circuit 150 is configured to perform calibration as described herein to independently determine I and Q-channel DC offset settings, despite the interdependent arrangement of DC offsets in quadrature TIA 130.

As shown, a controller 160, such as a microcontroller unit (MCU) that controls radio operations within receiver 100, may initiate such calibration via a calibration trigger signal. Although embodiments are not limited in this regard, a calibration may be triggered dynamically during normal radio operation, e.g., as a result of temperature changes, voltage changes, different frequencies of operation or so forth. Although shown at this high level in the embodiment of FIG. 1, many variations and alternatives are possible.

Figure 2:
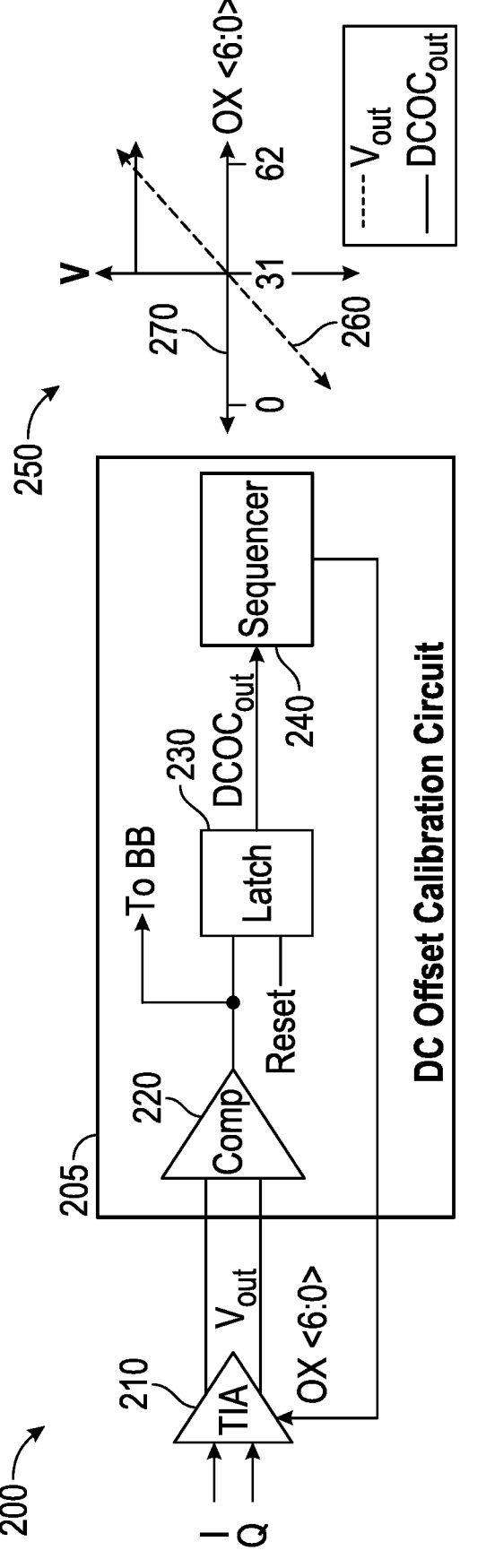
FIG. 2 is a block diagram illustrating an arrangement of a DC offset calibration circuit in accordance with an embodiment.

Referring now to FIG. 2, shown is a block diagram illustrating an arrangement of a DC offset calibration circuit in accordance with an embodiment. As shown in FIG. 2, apparatus 200 is a wireless receiver, such as may be part of a multi-protocol wireless transceiver that performs transmit and receive operations for various wireless communication protocols. In FIG. 2, a TIA 210 is present. TIA 210 in normal operation receives incoming current signals, which may be differential signals.

In turn, TIA 210 operates to amplify and output differential quadrature signals as output voltages (Vout). As further shown, TIA 210 also receives a DC offset setting (OX) [6:0]. This offset setting may be determined using DC offset calibration circuit 205. As illustrated, circuit 205 includes a comparator 220 that is coupled to receive the differential output from TIA 210 and perform a comparison therefrom. Although shown as a separate component in FIG. 2, understand that in one or more implementations, comparator 220 may be included within a peak detector of a receiver signal processing path, realizing reuse and reduced chip real estate and power consumption. As shown, in normal operation a peak detected signal, which in an embodiment may be an IF signal, is output to additional portions of a signal processing path (e.g., for baseband processing, not shown in FIG. 2).

For purposes of DC offset calibration, the comparison signal generated in comparator 220 is output to a latch 230, and thereafter is output as a DC offset calibration value to a sequencer 240. In embodiments herein, sequencer 240 may be implemented as a hardware finite state machine (FSM) that is configured to control DC offset calibration. During such calibration, comparator 220 compares the sign of a given I or Q-channel, to find a crossover point. As shown in inset 250 of FIG. 2, when this crossover occurs, the DC calibration output from latch 230 switches from zero to one, as illustrated at curve 270. Note that the X-axis represents the offset settings, which in this embodiment is a six-bit value.

Figure 3A:
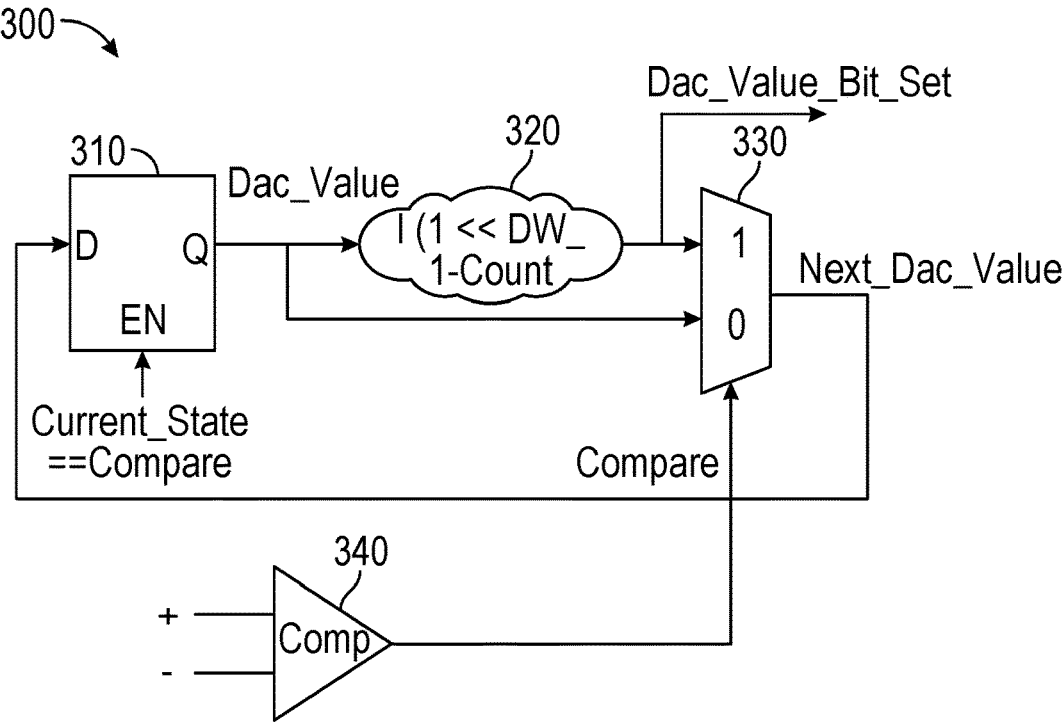
FIG. 3A is a block diagram of a portion of the circuitry included in a DC offset calibration circuit.

As discussed above, embodiments use a successive approximation technique to independently determine I and Q-channel DC offset settings in an interdependent TIA. Referring now to FIG. 3A, shown is a block diagram of a portion of the circuitry included in a DC offset calibration circuit. As illustrated in FIG. 3, circuit 300 is implemented as a successive approximation FSM to execute during a given calibration iteration. In this technique, a conversion includes a number of comparisons, namely N comparisons, where N is the bit width of the offset setting. In an implementation in which the offset setting is six bits, there are accordingly six comparisons performed.

As illustrated, a comparator 340 compares positive and negative voltages (e.g., of the I or Q-channel) injected into comparator 340, and outputs a comparison signal that is either a high or a low value. Depending upon the value, a multiplexer 330 is controlled to output a next DAC value, which it provides to a D-type flip-flop 310. In turn, flip-flop 310 outputs this value as a DAC value of a given bit. A successive approximation circuit 320 provides this value as a given bit of a conversion and also as an input to multiplexer 330.

The resulting values of the comparisons in a conversion operation are shown in Table 1. As shown in Table 1, in each iteration (comparison), a given bit of a DC offset setting is determined using circuitry such as circuit 300. As shown, in a first iteration, the most significant bit is determined by comparison to a midpoint offset setting (100000), and in each comparison a next least significant bit is determined.

TABLE 1

| count | dac[5] | dac[4] | dac[3] | dac[2] | dac[1] | dac[0] |
|---|---|---|---|---|---|---|
| 0 | 1 | 0 | 0 | 0 | 0 | 0 |
| 1 | D5 | 1 | 0 | 0 | 0 | 0 |
| 2 | D5 | D4 | 1 | 0 | 0 | 0 |
| 3 | D5 | D4 | D3 | 1 | 0 | 0 |
| 4 | D5 | D4 | D3 | D2 | 1 | 0 |
| 5 | D5 | D4 | D3 | D2 | D1 | 1 |
| 6 | D5 | D4 | D3 | D2 | D1 | D0 |

Figure 3B:
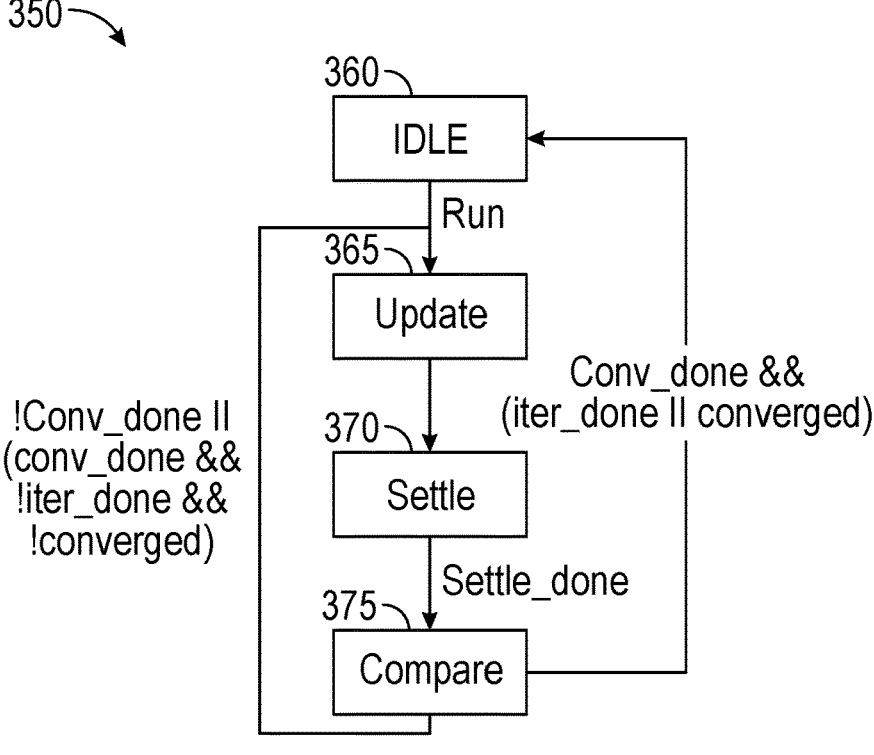
FIG. 3B is a flow diagram of this successive approximation technique.

Referring now to FIG. 3B, shown is a flow diagram of this successive approximation technique. As illustrated, FSM 300 iterates through a plurality of operations, beginning at an idle state 360, until it is triggered to execute. Thereafter an update is performed (block 365) where a given one of the I or Q-channel offset settings is updated. After the TIA is allowed to settle at block 370, the comparison is performed at block 375. Such operation proceeds until either a successive conversion converges with a prior conversion (e.g., they are the same value or within a threshold of each other) or a maximum number of iterations has been performed. At this point, the idle state may be returned to. Otherwise, additional updates may occur if no convergence or maximum iterations has occurred. Although shown at this high level in the embodiment of FIGS. 3A and 3B, understand that many variations and alternatives are possible.

Figure 4A:
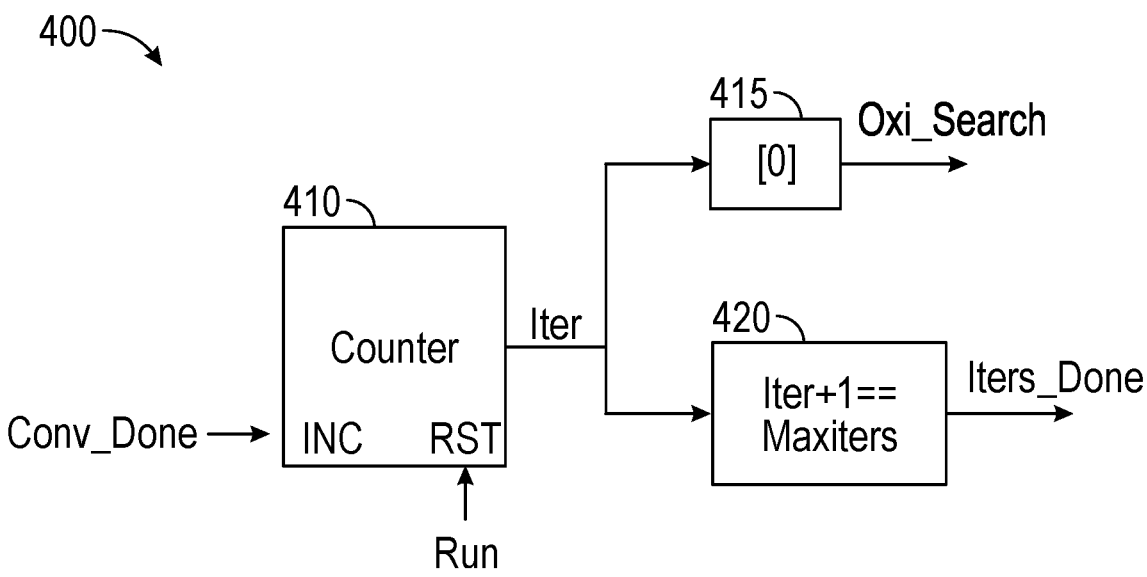
FIG. 4A is a block diagram of a portion of a DC offset calibration circuit in accordance with an embodiment.

Referring now to FIG. 4A, shown is a block diagram of a portion of a DC offset calibration circuit in accordance with an embodiment. As shown in FIG. 4A, circuit 400 includes a counter 410 that is configured to increment when a conversion is completed (such as discussed above in FIGS. 3A and 3B). The incremented value is output from counter 410 and updates a value provided to a comparison circuit 420 that determines whether a maximum number of iterations has been performed. Also, the number of iterations is analyzed in a circuit 415 that causes a switching of conversion between the I and Q-channels by sending a switch signal, Oxi_Search, that causes a switch between channels.

Figure 4B:
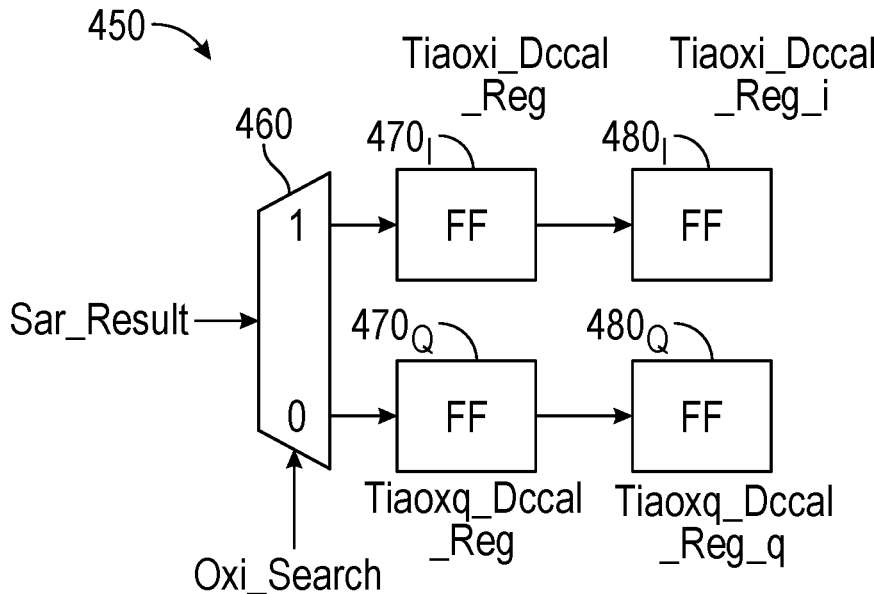
FIG. 4B is a block diagram of a further portion of a DC offset calibration circuit in accordance with an embodiment.

Referring now to FIG. 4B, shown is a block diagram of a further portion of a DC offset calibration circuit in accordance with an embodiment. Based on the conversion result (Sar_Result), an interim DC offset setting is provided to a multiplexer 460. Multiplexer 460 is controlled by the OXI search signal (output from circuit 400), to controllably provide the determined interim offset setting to storage for the appropriate I or Q-channel. As illustrated, each channel includes a pair of flip-flops to store successive interim offset values. More specifically, these flip-flops may be implemented as a set of registers $470_{I,Q}$ and $480_{I,Q}$.

When the values of two successive interim offset settings are the same (or, in some implementations, within a threshold of each other), convergence is detected. At convergence, the resulting converged DC offset settings may be stored in, e.g., registers 480 or another storage, and provided to DC offset compensation circuitry, such as the resistor DACs discussed above. Although shown at this high level in the embodiment of FIG. 4B, many variations and alternatives are possible.

Figure 5:
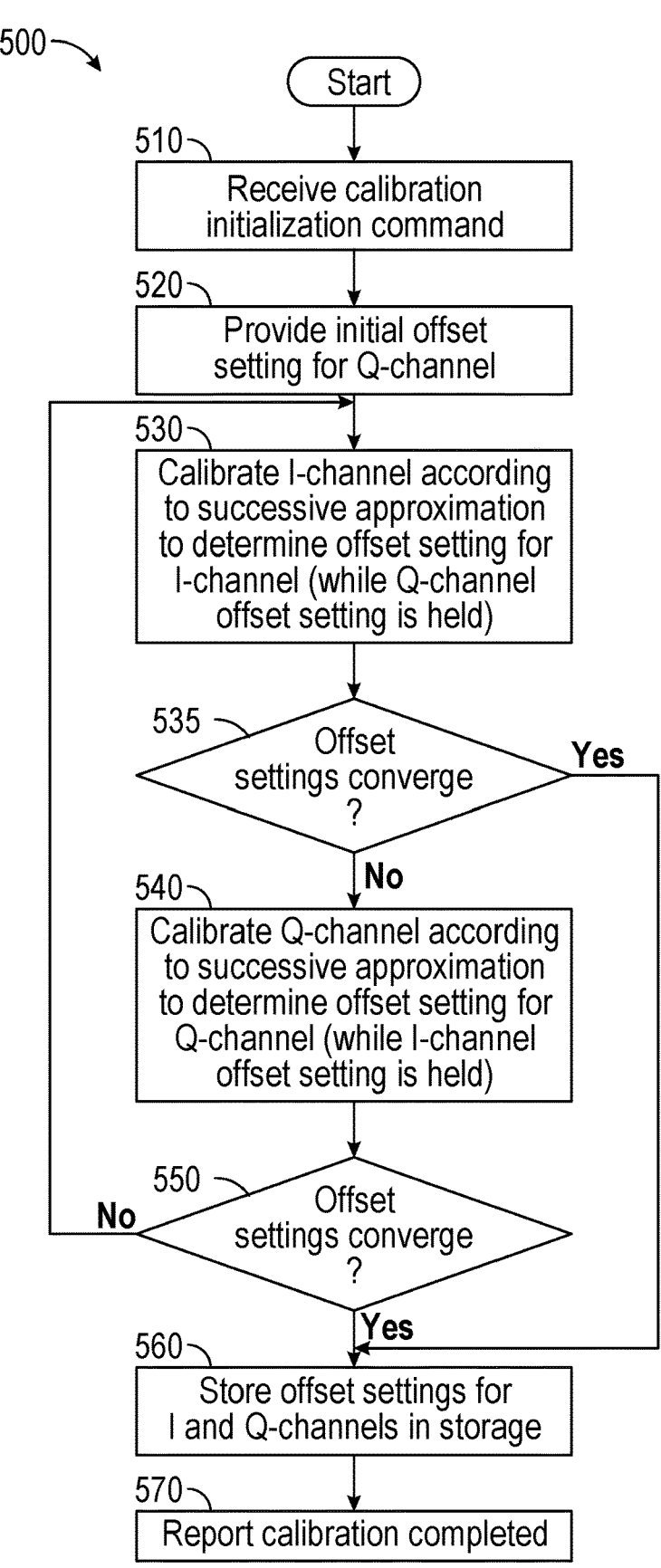
FIG. 5 is a flow diagram of a method in accordance with an embodiment.

Referring now to FIG. 5, shown is a flow diagram of a method in accordance with an embodiment. In FIG. 5, method 500 is performed by a controller, such as a hardware sequencer associated with a DC offset calibration circuit. In embodiments, the hardware sequencer may execute in response to receipt of a calibration initialization command (block 510). This command may be received, in an embodiment, from firmware. As an example, the firmware may trigger calibration, e.g., due to a change in operating conditions, such as temperature, operating frequency, or so forth, initialization, reset, and/or other condition.

Next at block 520, an initial offset setting is provided for a Q-channel. Depending upon implementation, this initial setting may be at a midpoint value of possible offset settings. For example, for a six-bit offset setting, the midpoint may be at a value of 31. In a case where seed values are available, this initial offset setting may be retrieved from a storage (such as a non-volatile memory). When the seed value is available, calibration may occur with fewer iterations, as the seed value may be relatively close to the final determined value. This is especially so when the operating temperature is around the same temperature as when the seed value was determined. Understand that in the implementation of FIG. 5, an initial Q-channel offset setting is held while the I-channel is first calibrated; vice versa operation is possible.

Still referring to FIG. 5, at block 530 the I-channel is calibrated according to a successive approximation technique. By way of this successive approximation technique, which is performed while the Q-channel offset setting is held, a number of comparisons may be performed, e.g., corresponding to the bit width of the offset setting. At the conclusion of these successive approximations, an offset setting is determined for the I-channel. Note at this point in the calibration, this offset setting may be considered to be an interim setting.

Control then passes to diamond 535, to determine whether the offset settings have converged. In an embodiment, this determination may be based on comparison of successive offset settings to determine whether they are of equal value or at least within a threshold level of each other. If the settings have converged, control passes to block 560, where the offset settings for both channels may be stored in a storage, e.g., register storage included within the DC offset calibration circuit. Thus in this implementation, calibrations may be performed independently for each channel, and it is possible to conclude calibration without performing a calibration for each channel in a given iteration.

Still referring to FIG. 5, if it is determined at diamond 535 that that offset settings have not converged, control passes to block 540. At block 540, the Q-channel is calibrated according to the same successive approximation technique to determine a Q-channel offset setting, while the previously determined I-channel offset setting is held. Control then passes to diamond 550, to determine whether the offset settings have converged. If the settings have not converged, the process repeats with each iteration further reducing the DC offset error.

Finally at block 570, the calibration is reported as completed, e.g., to the firmware, so that normal operation of the receiver may be entered with the new DC offset settings. Although shown at this high level in the embodiment of FIG. 5, understand that many variations and alternatives are possible. For example, while not expressly described in FIG. 5, understand that another determination may be made as to whether a maximum number of iterations has been performed. On such a determination, the current I and Q-channel DC offset settings can be stored and used for calibrations.

Figure 6:
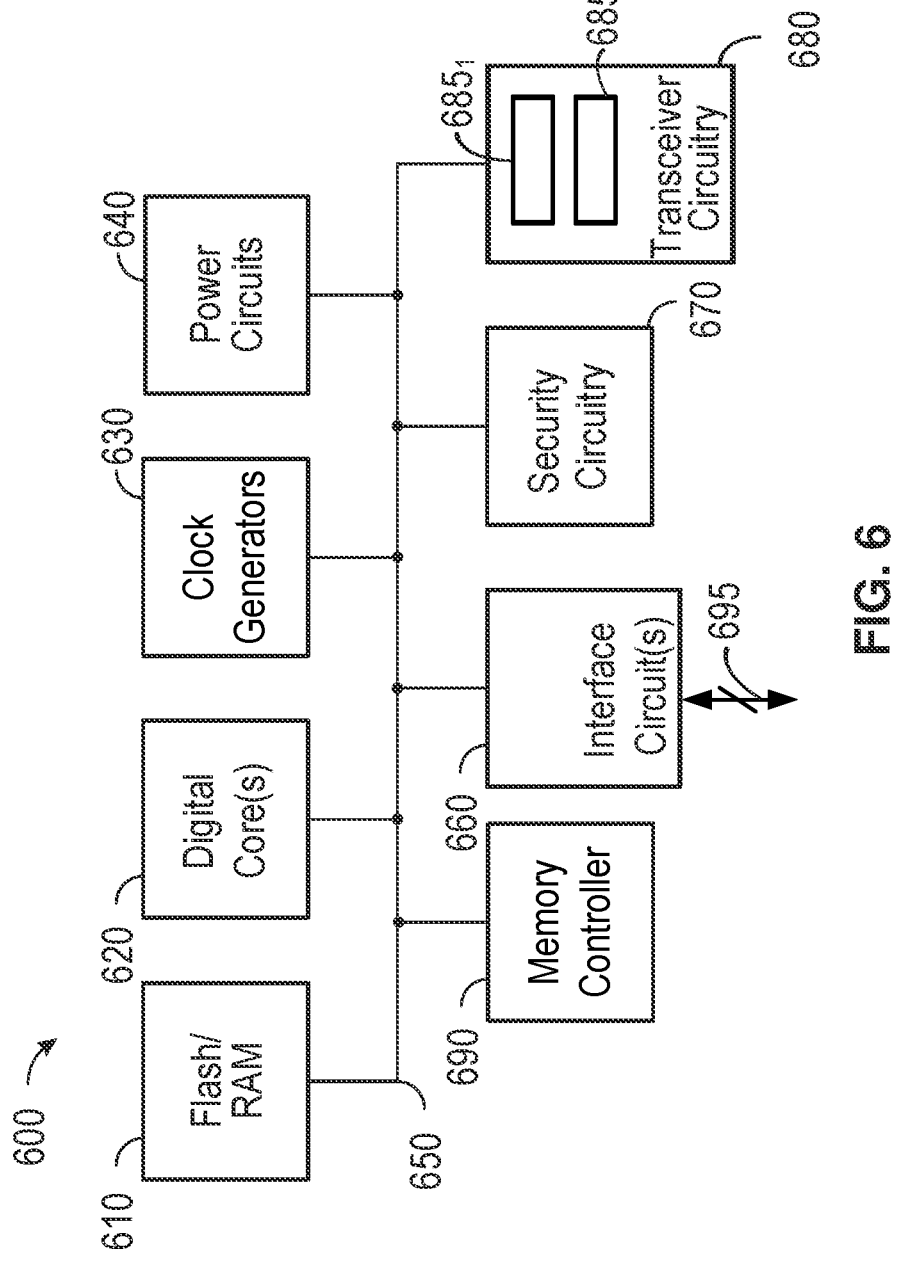
FIG. 6 is a block diagram of a representative integrated circuit that incorporates an embodiment.

Referring now to FIG. 6, shown is a block diagram of a representative integrated circuit 600 that includes DCOC circuitry, as described herein. In the embodiment shown in FIG. 6, integrated circuit 600 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 600 shown in FIG. 6 may be implemented on a single semiconductor die.

Integrated circuit 600 may be included in a range of devices including a variety of stations, including smartphones, wearables, smart home devices, IoT devices, other consumer devices, or industrial, scientific, and medical (ISM) devices, among others.

In the embodiment shown, integrated circuit 600 includes a memory system 610 which in an embodiment may include volatile storage, such as RAM and non-volatile memory as a flash memory. The flash memory is a non-transitory storage medium that can store instructions and data. Such non-volatile memory may store instructions, including instructions for performing DC offset correction calibration, as described herein. As further shown integrated circuit 600 also may include a memory controller 690.

Memory system 610 couples via a bus 650 to one or more digital cores 620, which may include one or more cores and/or microcontrollers that act as processing units of the integrated circuit. In turn, digital cores 620 may couple to clock generators 630 which may provide one or more phase locked loops or other clock generator circuitry to generate various clocks for use by circuitry of the IC.

As further illustrated, IC 600 further includes power circuitry 640, which may include one or more voltage regulators. Additional circuitry may be present depending on particular implementation to provide various functionality and interaction with external devices. Such circuitry may include interface circuitry 660 which provides a digital communication interface with additional circuitry (such as a memory, to couple to IC 600 via a link 695. IC 600 also may include security circuitry 670 to perform wireless security techniques.

In addition, as shown in FIG. 6, transceiver circuitry 680 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceivers $685_{1-n}$, at least one of which may include a TIA having DC offset interdependency that can be corrected in part based on independent calibration of I and Q-channel DC offset corrections as described herein. Understand while shown with this high level view, many variations and alternatives are possible.

Figure 7:
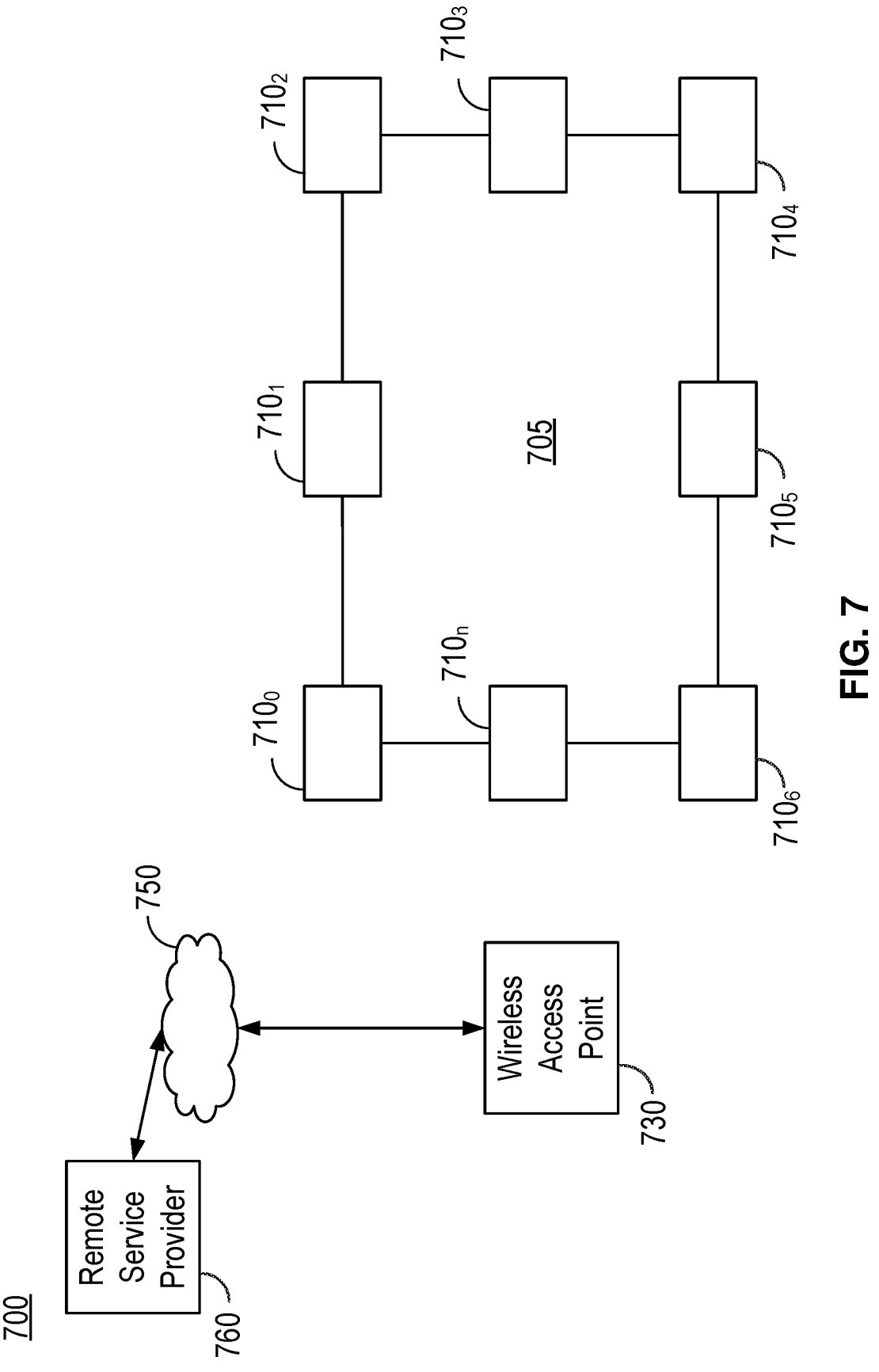
FIG. 7 is a high level diagram of a network in accordance with an embodiment.

ICs such as described herein may be implemented in a variety of different devices such as wireless stations, IoT devices or so forth. Referring now to FIG. 7, shown is a high level diagram of a network in accordance with an embodiment. As shown in FIG. 7, a network 700 includes a variety of devices, including wireless stations including smart devices such as IoT devices, access points and remote service providers, which may leverage embodiments for providing DC offset calibration as described herein.

In the embodiment of FIG. 7, a wireless network 705 is present, e.g., in a building having multiple wireless devices $7100\text{-}n$. As shown, wireless devices 710 couple to an access point 730 that in turn communicates with a remote service provider 760 via a wide area network 750, e.g., the internet. Understand while shown at this high level in the embodiment of FIG. 7, many variations and alternatives are possible.

While the present disclosure has been described with respect to a limited number of implementations, those skilled in the art, having the benefit of this disclosure, will appreciate numerous modifications and variations there-from. It is intended that the appended claims cover all such modifications and variations.

What is claimed is:

1. An apparatus comprising:
a low noise amplifier (LNA) to receive and amplify a radio frequency (RF) signal;
a mixer coupled to the LNA to downconvert the RF signal to a second frequency signal;
a quadrature transimpedance amplifier (TIA) to convert a current of the second frequency signal to a voltage signal, the quadrature TIA having an in-phase (I)-channel having an I-channel DC offset and a quadra-ture-phase (Q)-channel having a Q-channel DC offset; and
a DC offset calibration circuit coupled to the quadrature TIA, the DC offset calibration circuit to calibrate a DC offset of the quadrature TIA comprising the I-channel DC offset and the Q-channel DC offset, the DC offset calibration circuit to independently determine an I-channel DC offset setting while a Q-channel DC offset setting is held and independently determine the Q-channel DC offset setting while the I-channel DC offset setting is held, wherein the I-channel and the Q-channel of the quadrature TIA have a DC offset interdependency.

2. The apparatus of claim 1, wherein the DC offset calibration circuit comprises a sequencer to initiate the DC offset calibration in response to a trigger condition.

3. The apparatus of claim 2, wherein the sequencer is to control operation of the DC offset calibration according to a successive approximation.

4. The apparatus of claim 3, wherein the sequencer is to cause an initial Q-channel DC offset setting to be provided to the Q-channel and cause the DC offset calibration circuit to determine a first I-channel DC offset setting according to the successive approximation.

5. The apparatus of claim 4, wherein the sequencer is to thereafter cause the first I-channel DC offset setting to be provided to the I-channel and cause a determination of a first Q-channel DC offset according to the successive approxi-mation.

6. The apparatus of claim 5, wherein the DC offset calibration circuit is to iteratively determine the first I-chan-nel DC offset setting and the first Q-channel DC offset setting, until a convergence is detected.

7. The apparatus of claim 6, wherein the DC offset calibration circuit is to determine the convergence when a successive I-channel DC offset is within at least a threshold of the first I-channel DC offset.

8. The apparatus of claim 4, wherein the DC offset calibration circuit is to perform the DC offset calibration during a factory test and store a seed I-channel DC offset setting and a seed Q-channel DC offset setting in a non-volatile storage.

9. The apparatus of claim 8, wherein the DC offset calibration circuit is to provide the seed Q-channel DC offset setting as the initial Q-channel DC offset setting.

10. A method comprising:
initiating a DC offset calibration for a quadrature differ-ential amplifier having a first channel and a second channel, the first channel and the second channel hav-ing DC offset interdependency;
iteratively, until a convergence is detected, calibrating at least one of:

the second channel to determine a DC offset setting for the second channel while a DC offset setting for the first channel is held; and
the first channel to determine the DC offset setting for the first channel while the DC offset setting for the second channel is held;
storing a converged DC offset setting for the first channel in a first storage;
storing a converged DC offset setting for the second channel in a second storage; and
providing the converged DC offset setting for the first channel and the converged DC offset setting for the second channel to the quadrature differential amplifier to provide DC offset compensation.

11. The method of claim 10, further comprising detecting the convergence for the second channel when a successive DC offset setting for the second channel equals a preceding DC offset setting for the second channel.

12. The method of claim 10, further comprising detecting the convergence for the second channel when a successive DC offset setting for the second channel is within a threshold of a preceding DC offset setting for the second channel.

13. The method of claim 10, wherein initiating the DC offset calibration comprises providing an initial DC offset setting for the first channel.

14. The method of claim 13, wherein providing the initial DC offset setting for the first channel comprises providing a seed DC offset setting for the first channel, the seed DC offset setting for the first channel obtained from a non-volatile storage.

15. The method of claim 10, further comprising providing the converged DC offset setting for the first channel and the converged DC offset setting for the second channel to at least one digital-to-analog converter (DAC), the at least one DAC to output therefrom a DC offset compensation for the first channel and a DC offset compensation for the second channel.

16. The method of claim 10, further comprising, if the convergence is not detected, iteratively calibrating the sec-ond channel and the first channel for a predetermined number of iterations.

17. A system comprising:
an antenna to receive a radio frequency (RF) signal;
a low noise amplifier (LNA) coupled to the antenna to amplify the RF signal;
a mixer coupled to the LNA to down convert the RF signal to a second frequency signal;
a quadrature differential amplifier to amplify the second frequency signal and output a quadrature differential signal, the quadrature differential amplifier having an in-phase (I)-channel having an I-channel DC offset and a quadrature-phase (Q)-channel having a Q-channel DC offset, wherein the I-channel and the Q-channel have DC offset interdependency;
a DC offset calibration circuit coupled to the quadrature differential amplifier, the DC offset calibration circuit to independently determine, based at least in part on a seed value for at least one of the I-channel or the Q-channel, an I-channel DC offset setting and a Q-channel DC offset setting, to compensate for the I-channel DC offset and the Q-channel DC offset, wherein the DC offset calibration circuit is to:
calibrate the I-channel to determine the I-channel DC offset setting while the seed value for the Q-channel is held; and calibrate the Q-channel to determine the Q-channel DC offset setting while the I-channel DC offset setting is held;

a peak detector coupled to the quadrature differential amplifier to detect a peak signal from the quadrature differential signal; and a non-volatile memory to store the seed value for the at least one of the I-channel or the Q-channel.

18. The system of claim 17, wherein the DC offset calibration circuit is to iteratively calibrate the I-channel and the Q-channel until a convergence is detected.

19. The system of claim 17, further comprising a digital-to-analog converter (DAC) to receive the I-channel DC offset setting and the Q-channel DC offset setting and output, based thereon, an I-channel DC offset compensation value and a Q-channel DC offset compensation value.

* * * * *